US 7,060,330 B2

(12) United States Patent
Zheng et al.

(10) Patent No.: US 7,060,330 B2
(45) Date of Patent: Jun. 13, 2006

(54) METHOD FOR FORMING ULTRA LOW K FILMS USING ELECTRON BEAM

(75) Inventors: Yi Zheng, San Jose, CA (US); Srinivas D. Nemani, Sunnyvale, CA (US); Li-Qun Xia, Santa Clara, CA (US); Eric Hollar, Cupertino, CA (US); Kang Sub Yim, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 10/302,393

(22) Filed: Nov. 22, 2002

(65) Prior Publication Data

US 2004/0101633 A1 May 27, 2004

(51) Int. Cl.
*C23C 16/56* (2006.01)

(52) U.S. Cl. .................... 427/551; 427/596; 427/255.6; 427/249.1

(58) Field of Classification Search ................ 427/551, 427/596, 255.6, 249.1
See application file for complete search history.

(56) References Cited

U.S. PATENT DOCUMENTS

| | | |
|---|---|---|
| 4,845,054 A | 7/1989 | Mitchener .................... 437/238 |
| 5,000,113 A | 3/1991 | Wang et al. .................. 118/723 |
| 5,003,178 A | 3/1991 | Livesay .................... 250/492.3 |
| 5,554,570 A | 9/1996 | Maeda et al. ................ 437/235 |
| 5,776,990 A | 7/1998 | Hedrick et al. ................ 521/77 |
| 5,989,998 A | 11/1999 | Sugahara et al. ............ 438/623 |
| 6,051,321 A | 4/2000 | Lee et al. .................... 428/447 |
| 6,054,379 A | 4/2000 | Yau et al. .................... 438/623 |
| 6,068,884 A | 5/2000 | Rose et al. ................ 427/255.6 |
| 6,080,526 A | 6/2000 | Yang et al. .................. 430/296 |
| 6,159,871 A | 12/2000 | Loboda et al. |
| 6,271,146 B1 | 8/2001 | Ross |
| 6,303,047 B1 | 10/2001 | Aronowitz et al. ............. 252/1 |
| 6,312,793 B1 * | 11/2001 | Grill et al. ................ 428/312.6 |
| 6,316,063 B1 | 11/2001 | Andideh et al. ............. 427/577 |
| 6,340,628 B1 | 1/2002 | Van Cleemput et al. |
| 6,352,945 B1 | 3/2002 | Matsuki et al. ............. 438/778 |
| 6,383,955 B1 | 5/2002 | Matsuki et al. ............. 438/790 |
| 6,410,463 B1 | 6/2002 | Matsuki ..................... 438/790 |
| 6,432,846 B1 | 8/2002 | Matsuki ..................... 438/790 |
| 6,437,443 B1 | 8/2002 | Grill et al. .................. 257/758 |
| 6,441,491 B1 | 8/2002 | Grill et al. .................. 257/759 |
| 6,444,136 B1 | 9/2002 | Liu et al. |
| 6,455,445 B1 | 9/2002 | Matsuki ..................... 438/789 |
| 6,479,110 B1 | 11/2002 | Grill et al. .................. 427/577 |
| 6,486,082 B1 | 11/2002 | Cho et al. |
| 6,500,773 B1 | 12/2002 | Gaillard et al. .............. 438/790 |
| 6,509,259 B1 | 1/2003 | Wang et al. ................ 438/623 |
| 6,514,880 B1 | 2/2003 | Matsuki et al. ............. 438/780 |
| 6,524,974 B1 | 2/2003 | Sukharev .................... 438/787 |
| 6,541,367 B1 | 4/2003 | Mandal |
| 6,548,899 B1 | 4/2003 | Ross ......................... 257/750 |
| 6,582,777 B1 * | 6/2003 | Ross et al. ................... 427/551 |
| 6,583,048 B1 | 6/2003 | Vincent et al. .............. 438/623 |
| 6,583,071 B1 | 6/2003 | Weidman et al. ........... 438/787 |
| 6,593,655 B1 | 7/2003 | Loboda et al. |
| 6,596,627 B1 | 7/2003 | Mandal |
| 6,605,549 B1 | 8/2003 | Leu et al. |
| 6,652,922 B1 | 11/2003 | Forester et al. |
| 6,677,253 B1 | 1/2004 | Andideh et al. |
| 6,734,533 B1 | 5/2004 | Wong |
| 6,737,365 B1 | 5/2004 | Kloster et al. |
| 2002/0037442 A1 | 3/2002 | Grill et al. ................... 428/698 |
| 2002/0098714 A1 | 7/2002 | Grill et al. ................... 438/778 |
| 2002/0142579 A1 | 10/2002 | Vincent et al. .............. 438/623 |
| 2002/0142585 A1 | 10/2002 | Mandal ...................... 438/633 |
| 2002/0160626 A1 | 10/2002 | Matsuki et al. ............. 438/780 |
| 2002/0180051 A1 | 12/2002 | Grill et al. ................... 257/759 |
| 2002/0197849 A1 | 12/2002 | Mandal ...................... 438/633 |
| 2003/0008998 A1 | 1/2003 | Aoi ............................ 528/10 |
| 2003/0017718 A1 | 1/2003 | Aoi ........................... 438/778 |
| 2003/0040195 A1 | 2/2003 | Chang et al. ............... 438/782 |
| 2003/0104689 A1 | 6/2003 | Shioya et al. ............... 438/622 |
| 2003/0104708 A1 | 6/2003 | Cho et al. |
| 2003/0109136 A1 | 6/2003 | Shioya et al. ............... 438/687 |
| 2003/0111712 A1 | 6/2003 | Andideh ..................... 257/650 |
| 2003/0116421 A1 | 6/2003 | Xu et al. |
| 2003/0176030 A1 | 9/2003 | Tsuji et al. |
| 2003/0198742 A1 | 10/2003 | Vrtis et al. |
| 2003/0211244 A1 | 11/2003 | Li et al. |
| 2003/0211728 A1 | 11/2003 | Mandal |
| 2003/0224593 A1 | 12/2003 | Wong |
| 2003/0232137 A1 | 12/2003 | Vrtis et al. |
| 2004/0038514 A1 | 2/2004 | Hyodo et al. |
| 2004/0039219 A1 | 2/2004 | Chen et al. |
| 2004/0076764 A1 | 4/2004 | Forester et al. |
| 2004/0096593 A1 | 5/2004 | Lukas et al. |
| 2004/0096672 A1 | 5/2004 | Lukas et al. |

FOREIGN PATENT DOCUMENTS

| | | |
|---|---|---|
| EP | 0935283 A2 | 8/1999 |
| EP | 1 354 980 | 10/2003 |
| WO | WO 97/00535 A1 | 1/1997 |
| WO | WO 99/21706 | 5/1999 |
| WO | WO 01/29052 A1 | 4/2001 |
| WO | WO 01/48805 A1 | 7/2001 |
| WO | WO 01/61737 A1 * | 8/2001 |

OTHER PUBLICATIONS

U.S. Appl. No. 09/484,689, filed Jan. 18, 2000.
PCT International Search Report for PCT/US 03/14272 dated Jan. 21, 2004; AMAT/7034,PC.

* cited by examiner

*Primary Examiner*—Timothy Meeks
(74) *Attorney, Agent, or Firm*—Moser, Patterson & Sheridan

(57) ABSTRACT

The present invention generally provides a method for depositing a low dielectric constant film using an e-beam treatment. In one aspect, the method includes delivering a gas mixture comprising one or more organosilicon compounds and one or more hydrocarbon compounds having at least one cyclic group to a substrate surface at deposition conditions sufficient to deposit a non-cured film comprising the at least one cyclic group on the substrate surface. The method further includes substantially removing the at least one cyclic group from the non-cured film using an electron beam at curing conditions sufficient to provide a dielectric constant less than 2.5 and a hardness greater than 0.5 GPa.

25 Claims, 6 Drawing Sheets

METHOD FOR FORMING ULTRA LOW K FILMS USING ELECTRON BEAM

BACKGROUND OF THE INVENTION

1. Field of the Invention

The present invention relates to the fabrication of integrated circuits. More particularly, the invention relates to a method for depositing dielectric layers on a substrate and the structures formed by the dielectric layer.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.13 µm and even 0.1 µm feature sizes, and tomorrow's plants soon will be producing devices having even smaller geometries.

In order to further reduce the size of devices on integrated circuits, it has become necessary to use conductive materials having low resistivity and to use insulators having low dielectric constants to reduce the capacitive coupling between adjacent metal lines. One such low k material is spin-on glass, such as un-doped silicon glass (USG) or fluorine-doped silicon glass (FSG), which can be deposited as a gap fill layer in a semiconductor manufacturing process. Other examples of low k materials include carbon doped silicon dioxide and polytetrafluoroethylene. However, the continued reduction in device geometries has generated a demand for films having even lower k values.

Recent developments in low dielectric constants have focused on incorporating silicon, carbon, and oxygen atoms into the deposited film. One challenge in this area has been to develop a Si, C, and O containing film that has a low k value, but also exhibits desirable thermal and mechanical properties. Most often, films made of a Si, C, and O network that have a desirable dielectric constant exhibit poor mechanical strength and are easily damaged by etch chemistry and subsequent plasma exposure, causing failure of the integrated circuit.

Therefore, there is a need for a process for making low dielectric constant materials that would improve the speed and efficiency of devices on integrated circuits as well as the durability and mechanical integrity of the integrated circuit.

SUMMARY OF THE INVENTION

The present invention generally provides a method for depositing a low dielectric constant film. In one aspect, the method includes delivering a gas mixture comprising one or more organosilicon compounds and one or more hydrocarbon compounds having at least one cyclic group to a substrate surface at deposition conditions sufficient to deposit a non-cured film comprising the at least one cyclic group on the substrate surface and having a hardness less than about 0.3 GPa. The method further includes substantially removing the at least one cyclic group from the non-cured film using an electron beam at curing conditions sufficient to provide a dielectric constant less than 2.5 and a hardness greater than 0.5 GPa.

In another aspect, the method includes delivering a gas mixture comprising one or more organosilicon compounds, one or more hydrocarbon compounds having at least one cyclic group, and two or more oxidizing gases to a substrate surface at deposition conditions sufficient to deposit a non-cured film comprising the at least one cyclic group on the substrate surface and having a hardness less than 0.3 GPa, and substantially removing the at least one cyclic group from the non-cured film using an electron beam at curing conditions sufficient to provide a dielectric constant less than 2.2 and a hardness greater than 0.4 GPa.

In yet another aspect, the method includes delivering a gas mixture comprising two or more organosilicon compounds, one or more hydrocarbon compounds having at least one cyclic group, and one or more oxidizing gases to a substrate surface at deposition conditions sufficient to deposit a non-cured film comprising the at least one cyclic group on the substrate surface, and substantially removing the at least one cyclic group from the non-cured film using an electron beam at curing conditions sufficient to provide a dielectric constant less than 2.5 and a hardness greater than 0.5 GPa, wherein the electron beam has a dosage greater than about 200 micro coulombs per $cm^2$.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
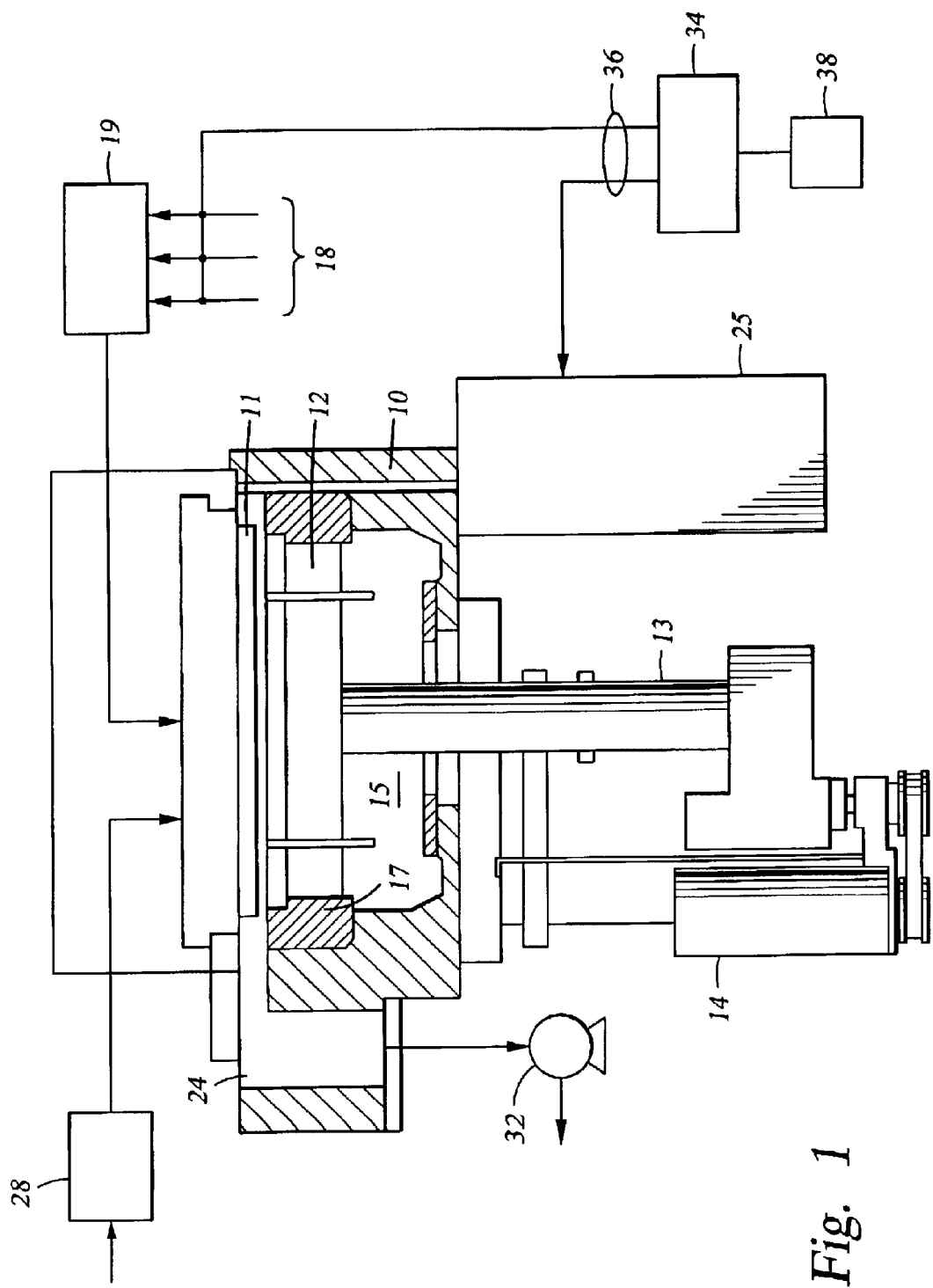
FIG. 1 is a cross-sectional diagram of an exemplary CVD reactor configured for use according to embodiments described herein.

The present invention includes a significant and unexpected reduction in dielectric constants for films comprising silicon, oxygen, and carbon by blending one or more compounds having at least one cyclic group, one or more organosilicon compounds, and optionally an oxidizing gas at conditions sufficient to form a pre-treated film network. In one aspect, one or more organic compounds having at least one cyclic group and one or more organosilicon compounds are reacted with an oxidizing gas in amounts sufficient to deposit a low dielectric constant film on a semiconductor substrate.

The film may be deposited using plasma assistance within a processing chamber capable of performing chemical vapor deposition (CVD). The plasma may be generated using pulse RF, high frequency RF, dual frequency, dual phase RF, or any other known or yet to be discovered plasma generation technique. Following deposition of the film, the film is cured by electron beam to remove pendant organic groups, such as cyclic groups of the organic compounds that have been incorporated into the film network during deposition.

The curing step supplies energy to the film network to volatize and remove at least a portion of the cyclic groups in the film network, leaving behind a more porous film network having a lower dielectric constant. In most cases, the cured film demonstrates a hardness at least two times, and as much as 600%, more than a non-cured film deposited according to embodiments described herein. Films cured using e-beam show an unexpected reduction in k value and an unexpected increase in hardness, not achievable with conventional curing techniques. Typically, the cured film has a dielectric constant of about 2.5 or less, preferably about 2.2 or less, and a hardness greater than about 0.6 GPa.

The term "organosilicon compound" as used herein is intended to refer to compounds containing carbon atoms in organic groups, and can be cyclic or linear. Organic groups may include alkyl, alkenyl, cyclohexenyl, and aryl groups in addition to functional derivatives thereof. Preferably, the organosilicon compounds includes one or more carbon atoms attached to a silicon atom whereby the carbon atoms are not readily removed by oxidation at suitable processing conditions. The organosilicon compounds may also preferably include one or more oxygen atoms. In one aspect, a preferred organosilicon compound has an oxygen to silicon atom ratio of at least 1:1, and more preferably at least 2:1, such as about 4:1.

Suitable cyclic organosilicon compounds include a ring structure having three or more silicon atoms, and optionally one or more oxygen atoms. Commercially available cyclic organosilicon compounds include rings having alternating silicon and oxygen atoms with one or two alkyl groups bonded to the silicon atoms. Some exemplary cyclic organosilicon compounds include:

| | |
|---|---|
| 1,3,5-trisilano-2,4,6-trimethylene, | $-(SiH_2CH_2)_3-$ (cyclic) |
| 2,4,6,8-tetramethylcyclotetrasiloxane (TMCTS) | $-(SiHCH_3-O)_4-$ (cyclic) |
| octamethylcyclotetrasiloxane (OMCTS), | $-(Si(CH_3)_2-O)_4-$ (cyclic) |
| 2,4,6,8,10-pentamethylcyclopentasiloxane, | $-(SiHCH_3-O)_5-$ (cyclic) |
| 1,3,5,7-tetrasilano-2,6-dioxy-4,8-dimethylene, | $-(SiH_2-CH_2-SiH_2-O)_2-$ (cyclic) |
| hexamethylcyclotrisiloxane | $-(Si(CH_3)_2-O)_3-$ (cyclic) |

Suitable linear organosilicon compounds include aliphatic organosilicon compounds having linear or branched structures with one or more silicon atoms and one or more carbon atoms. The organosilicon compounds may further include one or more oxygen atoms. Some exemplary linear organosilicon compounds include:

| | |
|---|---|
| methylsilane, | $CH_3-SiH_3$ |
| dimethylsilane, | $(CH_3)_2-SiH_2$ |
| trimethylsilane, | $(CH_3)_3-SiH$ |
| ethylsilane, | $CH_3-CH_2-SiH_3$ |
| disilanomethane, | $SiH_3-CH_2-SiH_3$ |
| bis(methylsilano)methane, | $CH_3-SiH_2-CH_2-SiH_2-CH_3$ |
| 1,2-disilanoethane, | $SiH_3-CH_2-CH_2-SiH_3$ |
| 1,2-bis(methylsilano)ethane, | $CH_3-SiH_2-CH_2-CH_2-SiH_2-CH_3$ |
| 2,2-disilanopropane, | $SiH_3-C(CH_3)_2-SiH_3$ |
| diethoxymethylsilane (DEMS), | $CH_3-SiH-(O-CH_2-CH_3)_2$ |
| 1,3-dimethyldisiloxane, | $CH_3-SiH_2-O-SiH_2-CH_3$ |
| 1,1,3,3-tetramethyldisiloxane, | $(CH_3)_2-SiH-O-SiH-(CH_3)_2$ |
| hexamethyldisiloxane (HMDS), | $(CH_3)_3-Si-O-Si-(CH_3)_3$ |
| 1,3-bis(silanomethylene)disiloxane, | $(SiH_3-CH_2-SiH_2)_2O$ |
| bis(1-methyldisiloxanyl)methane, | $(CH_3-SiH_2-O-SiH_2-)_2CH_2$ |
| 2,2-bis(1-methyldisiloxanyl)propane, | $(CH_3-SiH_2-O-SiH_2-)_2C(CH_3)_2$ |
| hexamethoxydisiloxane (HMDOS) | $(CH_3O)_3-Si-O-Si-(OCH_3)_3$ |
| dimethyldimethoxysilane (DMDMOS) | $(CH_3O)_2-Si-(CH_3)_2$ |
| dimethoxymethylvinylsilane (DMMVS) | $(CH_3O)_2-Si-(CH_3)-CH=CH_2$ |

The term "cyclic group" as used herein is intended to refer to a ring structure. The ring structure may contain as few as three atoms. The atoms may include carbon, silicon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bi-cyclic or tri-cyclic. Further, the cyclic group is preferably bonded to a linear or branched functional group. The linear or branched functional group preferably contains an alkyl or vinyl alkyl group and has between one and twenty carbon atoms. The linear or branched functional group may also include oxygen atoms, such as a ketone, ether, and ester. Some exemplary compounds having at least one cyclic group include alpha-terpinene (ATP), vinylcyclohexane (VCH), and phenylacetate, just to name a few.

Suitable oxidizing gasses include oxygen ($O_2$), ozone ($O_3$), nitrous oxide ($N_2O$), carbon monoxide (CO), carbon dioxide ($CO_2$), water ($H_2O$), 2,3-butane dione or combinations thereof. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the amount of ozone desired and the type of ozone generating equipment used. Disassociation of oxygen or the oxygen containing compounds may occur in a microwave chamber prior to entering the deposition chamber to reduce excessive dissociation of the silicon containing compounds. Preferably, radio frequency (RF) power is applied to the reaction zone to increase dissociation.

The e-beam treatment typically has a dose between about 50 and about 2000 micro coulombs per square centimeter ($\mu c/cm^2$) at about 1 to 20 kiloelectron volts (KeV). The e-beam treatment is typically operated at a temperature between about room-temperature and about 450° C. for about 1 minute to about 15 minutes, such as about 2 minutes. Preferably, the e-beam treatment is performed at about 400° C. for about 2 minutes. In one aspect, the e-beam treatment conditions include 4.5 kV, 1.5 mA and 500 $\mu c/cm^2$ at 400° C. Although any e-beam device may be used, one exemplary device is the EBK chamber, available from Applied Materials, Inc.

The e-beam curing process improves mechanical strength of the deposited film network and also lowers the k-value. The energized e-beam alters the chemical bonding in the molecular network of the deposited film and removes at least a portion of the molecular groups from the film. The removal of the molecular groups creates voids or pores within the film, lowering the k value. The e-beam treatment also strengthens the film network by cross-linking Si—O—Si or Si—C—Si chains as inferred from FTIR spectroscopy.

Preferably, the deposited film has a carbon content between about 10 and about 30 atomic percent, such as between about 10 and about 30 atomic percent after curing. The carbon content of the deposited films refers to an elemental analysis of the film structure. The carbon content is represented by the percent of carbon atoms in the deposited film, excluding hydrogen atoms, which are difficult to quantify. For example, a film having an average of one silicon atom, one oxygen atom, one carbon atom and two hydrogen atoms has a carbon content of 20 atomic percent (one carbon atom per five total atoms), or a carbon content of 33 atomic percent excluding hydrogen atoms (one carbon atom per three total atoms).

During deposition, the substrate is typically maintained at a temperature between about −20° C. and about 450° C. A power density ranging between about 0.03 W/cm² and about 3.2 W/cm², which is a RF power level of between about 10 W and about 2000 W for a 200 mm substrate is typically used. Preferably, the RF power level is between about 300 W and about 1700 W. The RF power is provided at a frequency between about 0.01 MHz and 300 MHz. The RF power may be cycled or pulsed to reduce heating of the substrate and promote greater porosity in the deposited film. The RF power may also be continuous or discontinuous. An exemplary processing chamber for depositing a low dielectric film according to embodiments described herein is described below.

Exemplary CVD Reactor

FIG. 1 shows a vertical, cross-section view of a parallel plate chemical vapor deposition processing chamber 10 having a high vacuum region 15. The processing chamber 10 contains a gas distribution manifold 11 having perforated holes for dispersing process gases there-through to a substrate (not shown). The substrate rests on a substrate support plate or susceptor 12. The susceptor 12 is mounted on a support stem 13 which connects the susceptor 12 to a lift motor 14. The lift motor 14 raises and lowers the susceptor 12 between a processing position and a lower, substrate-loading position so that the susceptor 12 (and the substrate supported on the upper surface of susceptor 12) can be controllably moved between a lower loading/off-loading position and an upper processing position which is closely adjacent to the manifold 11. When the susceptor 12 and the substrate are in the upper processing position, they are surrounded by an insulator 17.

During processing, gases introduced to the manifold 11 are uniformly distributed radially across the surface of the substrate. A vacuum pump 32 having a throttle valve controls the exhaust rate of gases from the chamber through a manifold 24. Deposition and carrier gases flow through gas lines 18 into a mixing system 19 and then to the manifold 11. Generally, each process gas supply line 18 includes (i) safety shut-off valves (not shown) that can be used to automatically or manually shut off the flow of process gas into the chamber, and (ii) mass flow controllers (also not shown) to measure the flow of gas through the gas supply lines 18. When toxic gases are used in the process, several safety shut-off valves are positioned on each gas supply line 18 in conventional configurations.

The deposition process performed in the processing chamber 10 can be either a thermal process or a plasma enhanced process. In a plasma process, a controlled plasma is typically formed adjacent the substrate by RF energy applied to the gas distribution manifold 11 using a RF power supply 25. Alternatively, RF power can be provided to the susceptor 12 or RF power can be provided to different components at different frequencies. The RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12.

When additional dissociation of the oxidizing gas is desired, an optional microwave chamber 28 can be used to input from between about 0 Watts and about 6000 Watts to the oxidizing gas prior to the gas entering the processing chamber 10. The additional microwave power can avoid excessive dissociation of the organosilicon compounds prior to reaction with the oxidizing gas. A gas distribution plate (not shown) having separate passages for the organosilicon compound and the oxidizing gas is preferred when microwave power is added to the oxidizing gas.

Typically, any or all of the chamber lining, distribution manifold 11, susceptor 12, and various other reactor hardware is made out of material such as aluminum or anodized aluminum. An example of such a CVD reactor is described in commonly assigned U.S. Pat. No. 5,000,113, entitled "A Thermal CVD/PECVD Reactor and Use for Thermal Chemical Vapor Deposition of Silicon Dioxide and In-situ Multi-step Planarized Process", issued to Wang et al., which is incorporated by reference herein. The processing system 10 may be integrated into an integrated processing platform, such as a Producer™ platform available from Applied Materials, Inc. Details of the Producer™ platform are described in commonly assigned U.S. Pat. No. 5,855,681, entitled "Ultra High Throughput Wafer Vacuum Processing System", issued to Maydan et al., which is incorporated by reference herein.

A system controller 34 controls the motor 14, the gas mixing system 19, and the RF power supply 25 which are connected therewith by control lines 36. The system controller 34 controls the activities of the CVD reactor and typically includes a hard disk drive, a floppy disk drive, and a card rack. The card rack contains a single board computer (SBC), analog and digital input/output boards, interface boards, and stepper motor controller boards. The system controller 34 conforms to the Versa Modular Europeans (VME) standard which defines board, card cage, and connector dimensions and types. The VME standard also defines the bus structure having a 16-bit data bus and 24-bit address bus.

Figure 2:
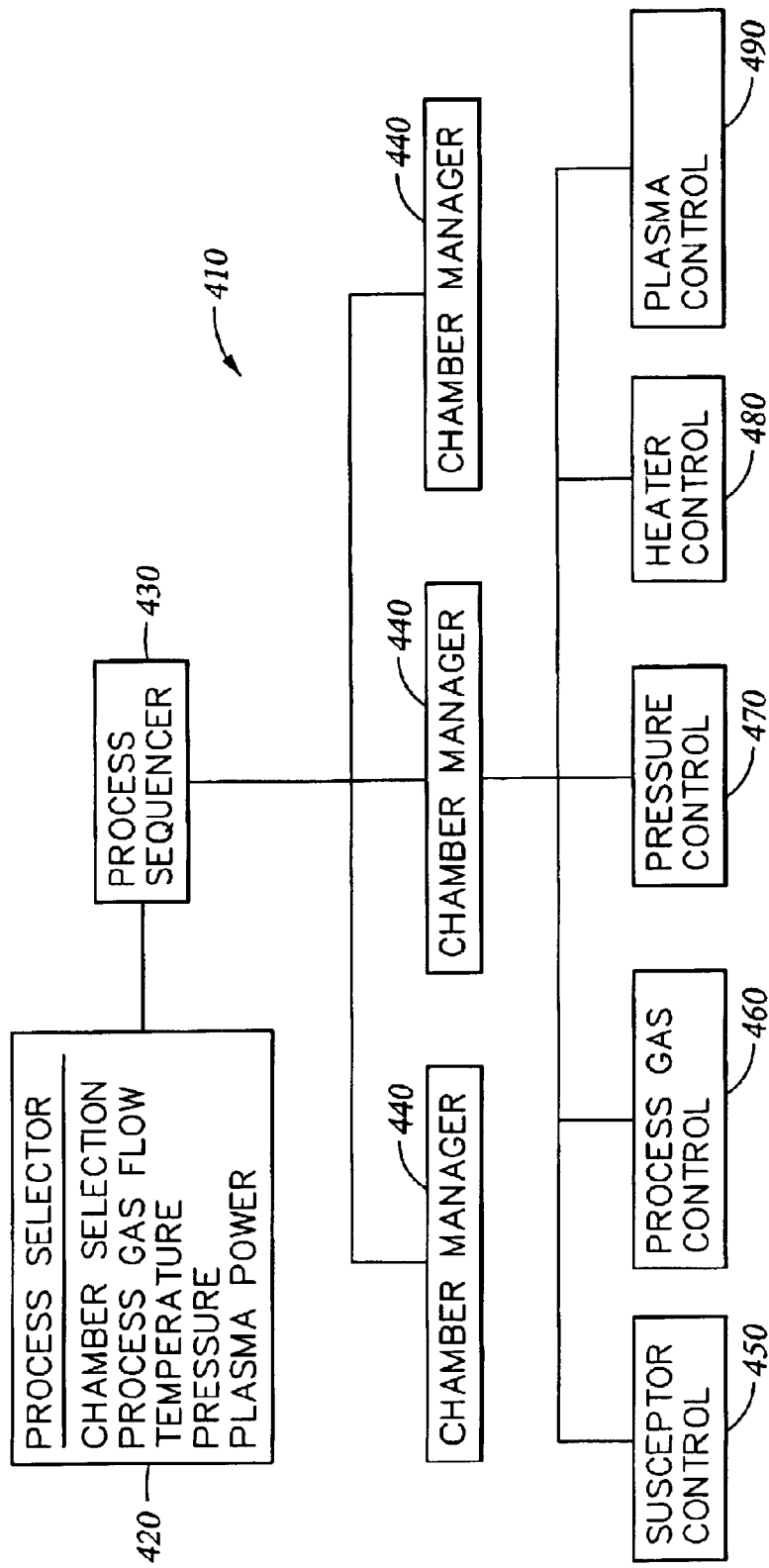
FIG. 2 is a flow chart of a hierarchical control structure of a computer program useful in conjunction with the exemplary CVD reactor of FIG. 1.

FIG. 2 is a flow chart of a hierarchical control structure of a computer program product useful in conjunction with the exemplary CVD reactor of FIG. 1. The system controller 34 operates under the control of a computer program 410 stored on the hard disk drive 38. The computer program dictates the timing, mixture of gases, RF power levels, susceptor position, and other parameters of a particular process. The computer program code can be written in any conventional computer readable programming language such as, for example, 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Still referring to FIG. 2, a user enters a process set number and process chamber number into a process selector subroutine 420 in response to menus or screens displayed on the CRT monitor by using the light pen interface. The process sets are predetermined sets of process parameters necessary to carry out specified processes, and are identified by predefined set numbers. The process selector subroutine 420 (i) selects a desired process chamber on a cluster tool such as an Centura® platform (available from Applied Materials, Inc.), and (ii) selects a desired set of process parameters needed to operate the process chamber for performing the desired process. The process parameters for performing a specific process are provided to the user in the form of a recipe and relate to process conditions such as, for example, process gas composition, flow rates, temperature, pressure, plasma conditions such as RF bias power levels and magnetic field power levels, cooling gas pressure, and chamber wall temperature. The parameters specified by the recipe are entered utilizing the light pen/CRT monitor interface. The signals for monitoring the process are provided by the analog input and digital input boards of the system controller 34 and the signals for controlling the process are output to the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling a process execute, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber according to the process set determined by the sequencer subroutine 430. For example, the chamber manager subroutine 440 includes program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in a processing chamber.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 450 comprises program code for controlling chamber components that are used to load the substrate onto the susceptor 12, and optionally to lift the substrate to a desired height in the processing chamber 10 to control the spacing between the substrate and the gas distribution manifold 11. When a substrate is loaded into the processing chamber 10, the susceptor 12 is lowered to receive the substrate, and thereafter, the susceptor 12 is raised to the desired height in the chamber to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440.

The process gas control subroutine 460 has program code for controlling process gas compositions and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as helium or argon is put into the processing chamber 10 to stabilize the pressure in the chamber before reactive process gases are introduced. For these processes, the process gas control subroutine 460 is programmed to include steps for flowing the inert gas into the chamber 10 for an amount of time necessary to stabilize the pressure in the chamber, and then the steps described above would be carried out. Additionally, when a process gas is to be vaporized from a liquid precursor, the process gas control subroutine 460 would be written to include steps for bubbling a delivery gas such as helium through the liquid precursor in a bubbler assembly. For this type of process, the process gas control subroutine 460 regulates the flow of the delivery gas, the pressure in the bubbler, and the bubbler temperature in order to obtain the desired process gas flow rates. As discussed above, the desired process gas flow rates are transferred to the process gas control subroutine 460 as process parameters. Furthermore, the process gas control subroutine 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 470 comprises program code for controlling the pressure in the processing chamber 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the processing chamber 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the processing chamber 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the processing chamber 10 is not properly set up.

The plasma control subroutine 490 comprises program code for setting the RF bias voltage power level applied to the process electrodes in the processing chamber 10, and optionally, to set the level of the magnetic field generated in the reactor. Similar to the previously described chamber component subroutines, the plasma control subroutine 490 is invoked by the chamber manager subroutine 440.

The pretreatment and method for forming a pretreated layer of the present invention is not limited to any specific apparatus or to any specific plasma excitation method. The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor.

Deposition of a Low Dielectric Constant Film

Figure 3:
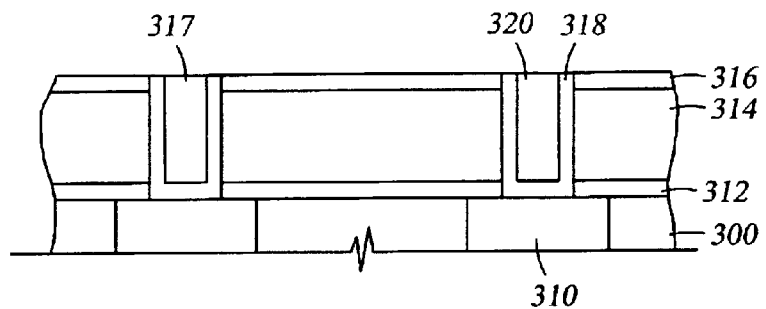
FIG. 3 is a cross sectional view showing a damascene structure comprising a low dielectric constant film as described herein.

FIG. 3 shows a damascene structure having a low dielectric constant film of the present invention deposited thereon. The low dielectric constant film is deposited as a dielectric layer 314 on a dielectric liner or barrier layer 312. A cap layer 316 is deposited on the dielectric layer 314. The cap layer 316 acts as an etch stop during further substrate processing or alternatively, as a liner layer. The cap layer 316, dielectric layer 314, and dielectric liner or barrier layer 312 are pattern etched to define the openings of interconnects 317 such as lines that expose underlying conducive features 310. A conductive liner/barrier layer 318 is deposited within the interconnects 317, and a conductive material 320 is deposited thereon to fill the interconnects 317. The substrate is typically planarized, as shown, after deposition.

Figure 4A:
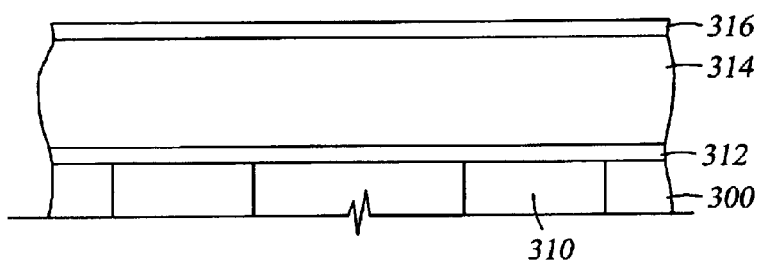
FIGS. 4A–4C are cross sectional views showing one embodiment of a damascene deposition sequence.
Figure 4B:
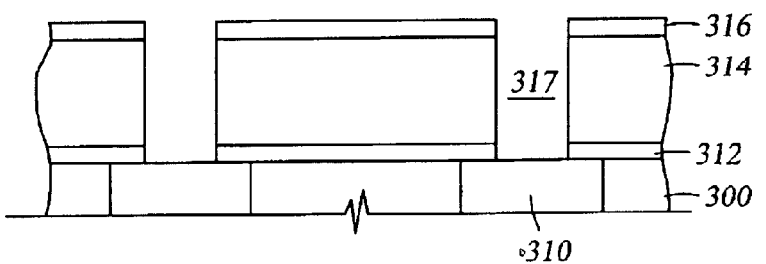
Figure 4C:
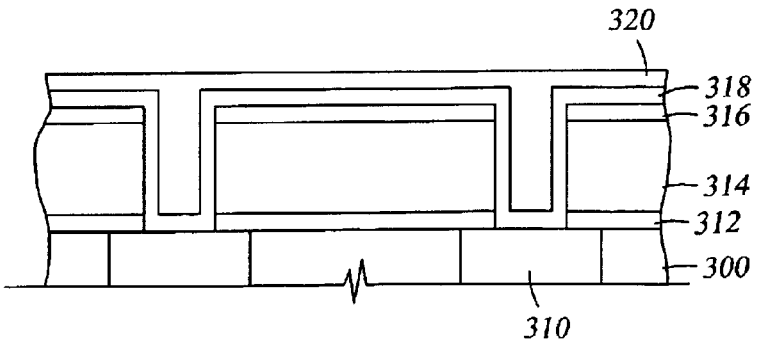

FIGS. 4A–4C are cross sectional views of a substrate 300 having the steps of the invention formed thereon. As shown in FIG. 4A, a dielectric layer 314 of the low dielectric constant film is deposited on the liner or barrier layer 312 to a thickness between about 5,000 Å to about 10,000 Å, depending on the size of the structure to be fabricated. The liner or barrier layer 312 may be a silicon carbide layer, for example, from the PECVD of an alkylsilane compound using a plasma of an inert gas. The silicon carbide layer may be doped with oxygen or nitrogen. The liner/barrier layer 312 may alternatively comprise another material, such as silicon nitride, which minimizes oxidation and/or diffusion of conductive materials, such as copper, which may comprise conductive features 310 previously formed in the substrate 300.

The cap layer 316, which can be a silicon carbide layer have a low dielectric constant, is then deposited on the dielectric layer 314 by reaction of the trimethylsilane to a thickness of about 200 Å to about 1000 Å using RF power in the range between about 10 and about 1000 watts for a 200 mm substrate. The silicon carbide material may be doped with oxygen or nitrogen.

As shown in FIG. 4B, the cap layer 316, the dielectric layer 314, and the liner or barrier layer 312 are then pattern etched to define the interconnects 317 and to expose the conductive feature 310 in substrate 300. Preferably, the cap layer 316, the dielectric layer 314, and the liner or barrier layer 312 are pattern etched using conventional photolithography and etch processes for silicon carbide films. Any photo resist or other material used to pattern the cap layer 316 is removed using an oxygen strip or other suitable process.

Following etching of the deposited material and removal of photo resist materials, exposed portions of the cap layer 316, the dielectric layer 314, and the liner or barrier layer 312 may be treated with a reactive pre-clean process to remove contaminants, particulate matter, residues, and oxides that may have formed on the exposed portions of the interconnects 317 and on the surface of the substrate. The reactive pre-clean process comprises exposing the substrate to a plasma, preferably comprising hydrogen, argon, helium, nitrogen, or mixtures thereof, at a power density between of 0.03 watts/cm$^2$ and about 3.2 watts/cm$^2$, or at a power level between about 10 watts and 1000 for a 200 millimeter substrate. The processing chamber is maintained at a pressure of about 20 Torr or less and at a substrate temperature of about 450° C. or less during the reactive clean process.

Referring to FIG. 4C, after the cap layer 316, the dielectric layer 314, and the liner or barrier layer 312 have been etched to define the interconnects 317 and the photo resist has been removed, the interconnects 317 are filled with a conductive material 320. The structure is preferably formed with a conductive material such as aluminum, copper, tungsten, or combinations thereof. Presently, the trend is to use copper to form the smaller features due to the low resistivity of copper (1.7 Ω-cm compared to 3.1 Ω-cm for aluminum).

Preferably, the conductive barrier layer 318 is first deposited conformably in the interconnects 317 to prevent copper migration into the surrounding silicon and/or dielectric material. Barrier layers include titanium, titanium nitride, tantalum, tantalum nitride, and combinations thereof among other conventional barrier layer materials. Thereafter, copper 320 is deposited using chemical vapor deposition, physical vapor deposition, electroplating, or combinations thereof, to form the conductive structure. Once the structure has been filled with copper or other conductive material, the surface is planarized using chemical mechanical polishing to produce the finished damascene structure shown in FIG. 3.

Figure 5:
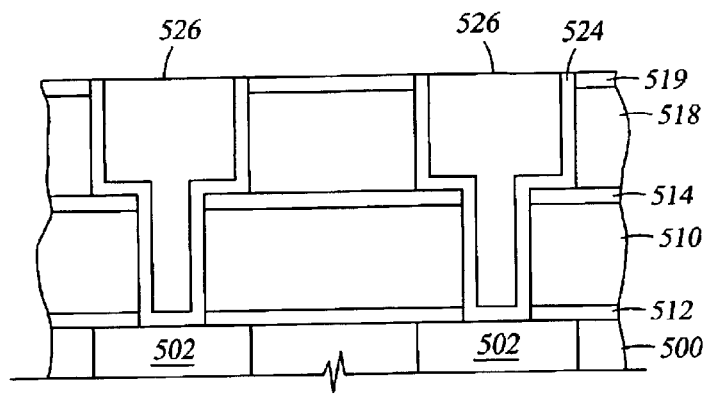
FIG. 5 is a cross sectional view showing a dual damascene structure comprising two low dielectric constant films as described herein.

FIG. 5 shows dual damascene structure which includes two low dielectric constant films and two silicon carbide cap layers or doped silicon carbide cap layers deposited thereon. A conductive feature 502 is formed in a substrate 500. The first low dielectric constant film is deposited as a first dielectric layer 510 on a liner or barrier layer 512, for example, silicon carbide. A first silicon carbide cap layer 514 is deposited on the first dielectric layer 510. The silicon carbide cap layer 514 reduces the dielectric constant of the low dielectric constant film and is pattern etched to define the openings of vertical interconnects such as contacts/vias. For the dual damascene application, a second dielectric layer 518 comprising the second low dielectric constant film is deposited over the patterned silicon carbide cap layer 514. The second silicon carbide cap layer 519 is deposited on the second dielectric layer 518 and pattern etched to define horizontal interconnects such as lines. An etch process is performed to define the horizontal interconnects down to the first silicon carbide layer 314 which functions as an etch stop, and to define the vertical interconnects and expose the conductive feature 502 in substrate 500 prior to filling the interconnects with a conductive material 526.

Figure 6A:
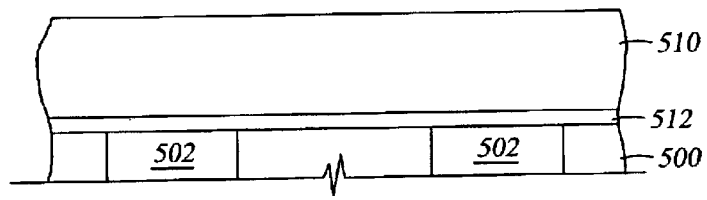
FIGS. 6A–6E are cross sectional views showing one embodiment of a dual damascene deposition sequence.

A preferred method for making the dual damascene structure shown in FIG. 5 is sequentially depicted in FIGS. 6A–6E, which are cross sectional views of a substrate having the steps of the invention formed thereon. As shown in FIG. 6A, an initial first dielectric layer 510 of the low dielectric constant film is deposited on the liner or barrier layer 512 to a thickness between about 5,000 Å and about 10,000 Å, depending on the size of the structure to be fabricated. The liner layer 512 may be a silicon carbide layer, which may be doped with oxygen or nitrogen. The liner/barrier layer 512 may alternatively comprise another material, such as silicon nitride, which minimizes oxidation and/or diffusion of conductive materials, such as copper, which may comprise conductive features 502 previously formed in the substrate 500.

Figure 6B:
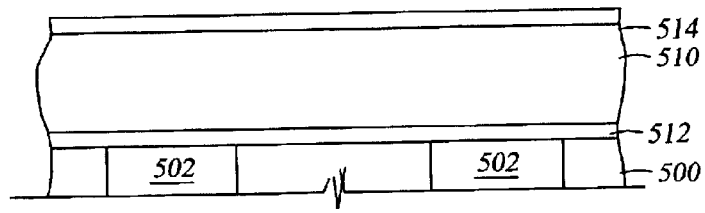
Figure 6C:
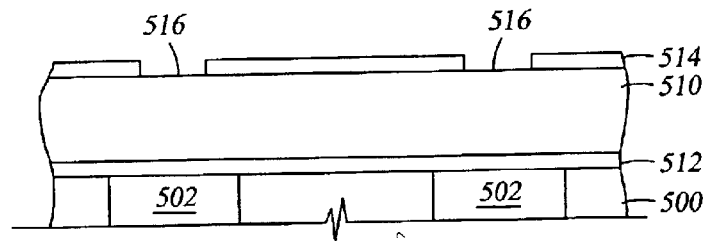

As shown in FIG. 6B, the first cap layer 514, which includes a silicon carbide layer or doped silicon carbide layer is then deposited on the first dielectric layer to a thickness between about 200 and about 1000 Å using RF power in the range between about 10 and about 1000 watts for a 200 mm substrate. The first cap layer 514 is then pattern etched to define the contact/via openings 516 and to expose first dielectric layer 510 in the areas where the contacts/vias are to be formed as shown in FIG. 6C. Preferably, the first cap layer 514 is pattern etched using conventional photolithography and etch processes for silicon carbide films.

Figure 6D:
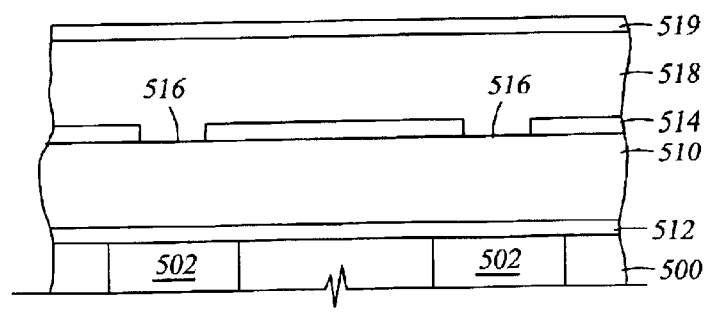

After the first cap layer 514 has been etched to pattern the contacts/vias 516 and the photo resist has been removed, a second dielectric layer 518 is deposited over the first cap layer 514 to a thickness between about 5,000 Å and about 10,000 Å as described for the first dielectric layer 510 as shown in FIG. 6D.

Figure 6E:
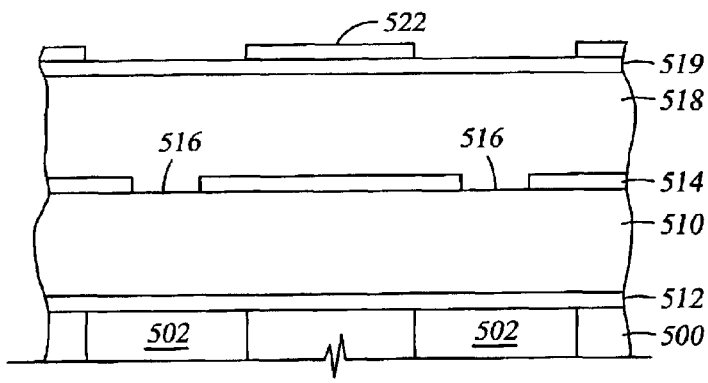
Figure 6F:
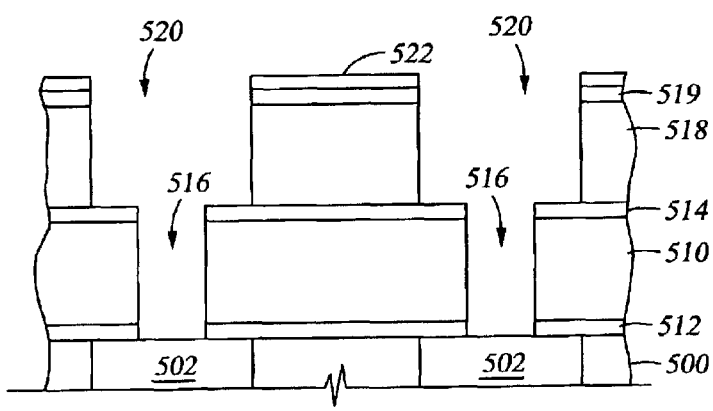

A second cap layer 519, which includes a silicon carbide layer or doped silicon carbide layer is then deposited on the second dielectric layer 518 to a thickness of about 200 to about 1000 Å. The silicon carbide material may be doped with oxygen or nitrogen. The second cap layer 519 is then patterned to define lines 520, as shown in FIG. 6E. The lines 520 and contacts/vias 516 are then etched using reactive ion etching or other anisotropic etching techniques to define the metallization structure (i.e., the openings for the lines and contact/via) and expose the conductive feature 502 as shown in FIG. 6F. Any photo resist or other material used to pattern and etch the second cap layer 519 is removed using an oxygen strip or other suitable process.

Following etching of the deposited material and removal of photo resist materials, exposed portions of the second cap layer 519, the second dielectric layer 518, the first cap layer 514, the first dielectric layer 510, and the liner or barrier layer 512 may be treated with a reactive pre-clean process, as described above, to remove contaminants, particulate matter, residues, and oxides that may have formed on the exposed portions of the contact/via openings 516, the line openings 520, and the conductive feature 502.

Figure 6G:
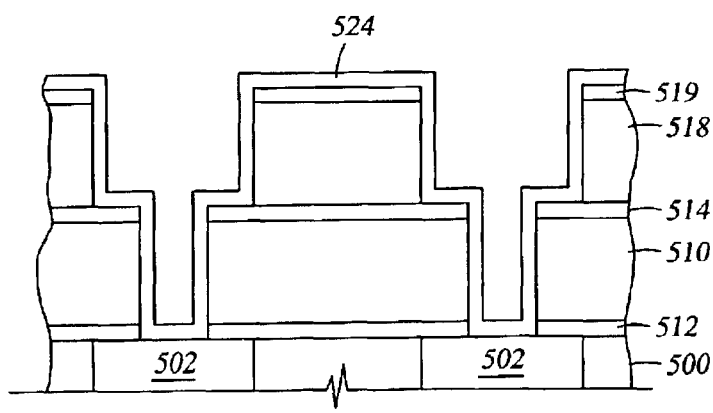

The metallization structure is then formed with a conductive material such as aluminum, copper, tungsten or combinations thereof. Presently, the trend is to use copper to form the smaller features due to the low resistivity of copper (1.7 Ω-cm compared to 5.1 Ω-cm for aluminum). Preferably, as shown in FIG. 6G, a conductive barrier layer 524 is first deposited conformably in the metallization pattern to prevent copper migration into the surrounding silicon and/or dielectric material. Barrier layers include titanium, titanium nitride, tantalum, tantalum nitride, and combinations thereof among other conventional barrier layer materials. Thereafter, copper 526 is deposited using either chemical vapor deposition, physical vapor deposition, electroplating, or combinations thereof to form the conductive structure. Once the structure has been filled with copper or other metal, the surface is planarized using chemical mechanical polishing as shown in FIG. 5.

Figure 7:
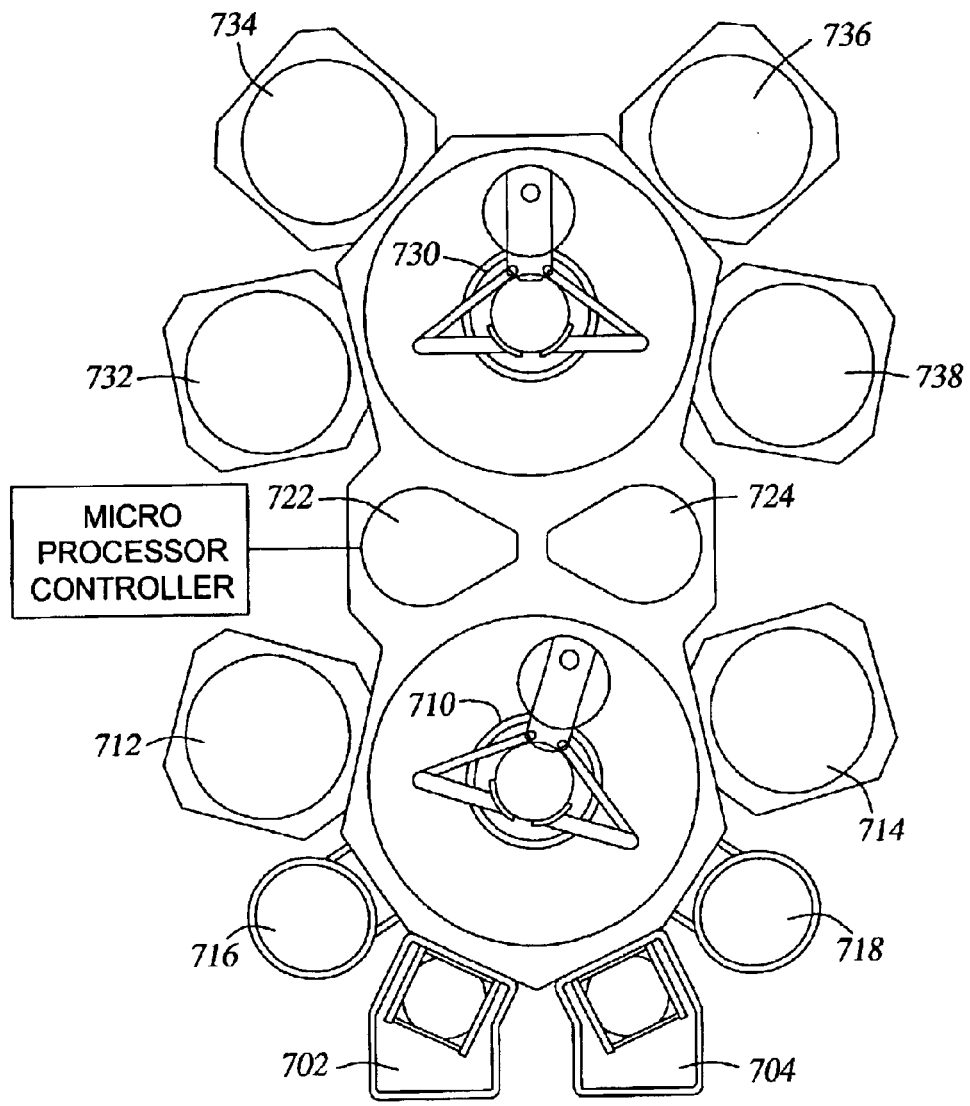
FIG. 7 shows an exemplary integrated processing platform.

These processing steps are preferably integrated on a processing platform to avoid interim contamination of the substrate. One exemplary integrated processing tool is an ENDURA platform available from Applied Materials, Inc. of Santa Clara, Calif. FIG. 7 shows a schematic plan view of an exemplary multi-chamber processing system 700, such as the ENDURA platform. A similar multi-chamber processing system is disclosed in U.S. Pat. No. 5,186,718, entitled "Stage Vacuum Wafer Processing System and Method," issued on Feb. 16, 1993, which is incorporated by reference herein.

The system 700 generally includes load lock chambers 702, 704 for the transfer of substrates into and out from the system 700. Since the system 700 is typically under vacuum, the load lock chambers 702, 704 may "pump down" the substrates introduced into the system 700. A first robot 710 may transfer the substrates between the load lock chambers 702, 704, and a first set of one or more substrate processing chambers 712, 714, 716, 718 (four are shown). Each processing chamber 712, 714, 716, 718, can be outfitted to perform a number of substrate processing operations such as cyclical layer deposition, chemical vapor deposition (CVD), physical vapor deposition (PVD), etch, pre-clean, degas, orientation and other substrate processes. The first robot 710 also transfers substrates to and from one or more transfer chambers 722, 724.

The transfer chambers 722, 724, are used to maintain ultrahigh vacuum conditions while allowing substrates to be transferred within the system 700. A second robot 730 may transfer the substrates between the transfer chambers 722, 724 and a second set of one or more processing chambers 732, 734, 736, 738. Similar to processing chambers 712, 714, 716, 718, the processing chambers 732, 734, 736, 738 can be outfitted to perform a variety of substrate processing operations, such as cyclical deposition, chemical vapor deposition (CVD), physical vapor deposition (PVD), etch, pre-clean, degas, and orientation, for example. Any of the substrate processing chambers 712, 714, 716, 718, 732, 734, 736, 738 may be removed from the system 700 if not necessary for a particular process to be performed by the system 700.

In one arrangement, each processing chamber 732 and 738 may be a cyclical deposition chamber adapted to deposit a nucleation layer; each processing chamber 734 and 736 may be a cyclical deposition chamber, a chemical vapor deposition chamber, or a physical vapor deposition chamber adapted to form a bulk fill deposition layer; each processing chamber 712 and 714 may be a chemical vapor deposition chamber, or a cyclical deposition chamber adapted to deposit a dielectric layer as described herein; and each processing chamber 716 and 718 may be an etch chamber outfitted to etch apertures or openings for interconnect features. This one particular arrangement of the system 700 is provided to illustrate the invention and should not be used to limit the scope of the invention.

The following examples illustrate the low dielectric films of the present invention. The films were deposited on 200 mm substrates using a chemical vapor deposition chamber, such as the "Producer DxZ" system, available from Applied Materials, Inc. of Santa Clara, Calif.

EXAMPLE 1

A low dielectric constant film was deposited on each of three 200 mm substrates at about 8 Torr and temperature of about 200° C. The following processing gases and flow rates were used:

Alpha-terpinene (ATP), at 3,000 mgm;

Diethoxymethylsilane (DEMS), at 800 mgm; and

Carbon dioxide, at 1,000 sccm.

Each substrate was positioned 300 mils from the gas distribution showerhead. A power level of 600 W at a frequency of 13.56 MHz was applied to the showerhead for plasma enhanced deposition of the films. Each film was deposited at a rate of about 2,700 Å/min, and had a dielectric constant (k) of about 5.4 measured using a SSM 5100 Hg CV measurement tool at 0.1 MHz. Each film also exhibited a hardness of about 0.1 GPa.

Thermal Anneal:

The first deposited film was subjected to a thermal anneal process. The anneal treatment utilized a temperature of about 425° C. at a pressure of about 10 Torr in an inert gas environment for about 4 hours. Shorter anneal times resulted in higher k values. The thermally annealed film had a lowest k value of about 2.1 and a hardness of about 0.2 GPa.

E-BEAM @ 400° C.:

The second deposited film was subjected to a high temperature electron beam (e-beam) treatment using a dose of about 300 μc/cm$^2$, at about 4.5 KeV and 1.5 mA, and at about 400° C. The e-beam treatment lasted for about 2 minutes. Following the e-beam treatment, the film exhibited a dielectric constant of about 2.1 which is about 60% less than the non-cured films and similar to the lowest value of the thermally annealed film. The e-beam film also exhibited a hardness of about 0.7 GPa, which is about an 600% increase compared to the non-cured films, and a 250% increase compared to the thermally annealed film.

E-Beam at Room Temperature:

The third deposited film was subjected to a low temperature electron beam (e-beam) treatment using a dose of about 300 μc/cm$^2$, at about 4.5 KeV and 1.5 mA, and at about 35°

C. The e-beam treatment lasted for about 2 minutes. Following the e-beam treatment, the film exhibited a dielectric constant of about 2.3 which is about 57% less than the non-cured films. The e-beam film also exhibited a hardness of about 0.5 GPa, which is about an 400% increase compared to the non-cured films, and a 150% increase compared to the thermally annealed film.

EXAMPLE 2

A low dielectric constant film was deposited on each of three substrates at about 8 Torr and temperature of about 225° C. The following processing gases and flow rates were used:

Alpha-terpinene (ATP), at 3,000 mgm;

Diethoxymethylsilane (DEMS), at 800 mgm;

Carbon dioxide, at 1,500 sccm; and

Oxygen, at 100 sccm.

Each substrate was positioned 300 mils from the gas distribution showerhead. A power level of 600 W at a frequency of 13.56 MHz was applied to the showerhead for plasma enhanced deposition of the films. Each film was deposited at a rate of about 1,800 Å/min, and had a dielectric constant (k) of about 2.85 measured using SSM 5100 Hg CV measurement tool at 0.1 MHz. Each film also exhibited a hardness of about 0.23 GPa.

Thermal Anneal:

The first deposited film was subjected to a thermal anneal process. The anneal treatment utilized a temperature of about 450° C. at a pressure of about 10 Torr in an inert gas environment for about 30 minutes. Shorter anneal times resulted in higher k values. The thermally annealed film had a refractory index (RI) of about 1.29, a lowest k value of about 2.08, and a hardness of about 0.23 GPa.

E-BEAM @ 400° C. and 200 $\mu c/cm^2$:

The second deposited film was subjected to a high temperature electron beam (e-beam) treatment using a dose of about 200 $\mu c/cm^2$, at about 4.5 KeV and 1.5 mA, and at about 400° C. The e-beam treatment lasted for about 100 seconds. Following the e-beam treatment, the film exhibited a dielectric constant of about 2.07 which is about 27% less than the non-cured films and similar to the lowest value of the thermally annealed film. The e-beam film also exhibited a hardness of about 0.42 GPa, which is about an 80% increase compared to the non-cured films and the thermally annealed film.

E-BEAM @ 400° C. and 500 $\mu c/cm^2$:

The third deposited film was subjected to a low temperature electron beam (e-beam) treatment using a dose of about 500 $\mu c/cm^2$, at about 4.5 KeV and 1.5 mA, and at about 35° C. The e-beam treatment lasted for about 250 seconds. Following the e-beam treatment, the film exhibited a dielectric constant of about 2.14 which is about 25% less than the non-cured films. The e-beam film also exhibited a hardness of about 0.74 GPa, which is about a 220% increase compared to the non-cured films and the thermally annealed film.

EXAMPLE 3

A low dielectric constant film was deposited on each of two substrates at about 8 Torr and a temperature of about 225° C. The following processing gases and flow rates were used:

Alpha-terpinene (ATP), at 4,000 mgm;

Octamethylcyclotetrasiloxane (OMCTS), at 200 mgm;

Oxygen, at 200 sccm; and

Carbon dioxide 2,000 sccm.

Each substrate was positioned about 300 mils from the gas distribution showerhead. A power level of 500 W at a frequency of 13.56 MHz was applied o the showerhead for plasma enhanced deposition of the films. Each film was deposited at a rate of about 1,000 Å/min, and had a dielectric constant (k) of about 4.0 measured using a SSM 5100 Hg CV measurement tool at 0.1 MHz. Each film also exhibited a hardness of about 0.1 GPa.

E-BEAM @ 400° C. and 120 $\mu c/cm^2$:

The first deposited film was subjected to a high temperature electron beam (e-beam) treatment using a dose of about 120 $\mu c/cm^2$, at about 4.5 KeV and 1.5 mA, and at about 400° C. The e-beam treatment lasted for about 30 seconds. Following the e-beam treatment, the film exhibited a dielectric constant of about 1.9 which is about 52% less than the non-cured films. The e-beam film also exhibited a hardness of about 0.5 GPa, which is about a 400% increase compared to the non-cured films.

E-BEAM @ 400° C. and 600 $\mu c/cm^2$:

The second deposited film was subjected to a low temperature electron beam (e-beam) treatment using a dose of about 600 $\mu c/cm2$, at about 4.5 KeV and 1.5 mA, and at about 400° C. The e-beam treatment lasted for about 150 seconds. Following the e-beam treatment, the film exhibited a dielectric constant of about 2.2, which is about 45% less than the non-cured films. The e-beam film also exhibited a hardness of about 0.8 GPa, which is about a 700% increase compared to the non-cured films.

EXAMPLE 4

A low dielectric constant film was deposited on a substrate at about 8 Torr and a temperature of about 225° C. The following processing gases and flow rates were used:

ATP, at 3,000 mgm;

TMS, at 500 sccm;

DEMS, at 600 mgm;

Oxygen, at 100 sccm; and

Carbon dioxide, at 1,500 sccm.

The substrate was positioned about 300 mils from the gas distribution showerhead. A power level of 600 W at a frequency of 13.56 MHz was applied o the showerhead for plasma enhanced deposition of the films. The film was deposited at a rate of about 2,000 Å/min, and had a dielectric constant (k) of about 4.3 measured using a SSM 5100 Hg CV measurement tool at 0.1 MHz. The film also exhibited a hardness of about 0.1 GPa.

E-BEAM @ 400° C. and 200 $\mu c/cm^2$:

The deposited film was subjected to a high temperature electron beam (e-beam) treatment using a dose of about 200 $\mu c/cm2$, at about 4.5 KeV and 1.5 mA, and at about 400° C. The e-beam treatment lasted for about 30 seconds. Following the e-beam treatment, the film exhibited a dielectric constant of about 2.2 which is about 50% less than the non-cured film. The e-beam film also exhibited a hardness of about 0.7 GPa, which is about a 600% increase compared to the non-cured film.

EXAMPLE 5

A low dielectric constant film was deposited on a substrate at about 8 Torr and a temperature of about 225° C. The following processing gases and flow rates were used:

ATP, at 4,000 mgm;

TMS, at 1,000 sccm;

OMCTS, at 200 mgm

Oxygen, at 100 sccm; and

Carbon dioxide, at 1,500 sccm.

The substrate was positioned about 300 mils from the gas distribution showerhead. A power level of 500 W at a frequency of 13.56 MHz was applied o the showerhead for plasma enhanced deposition of the films. The film was deposited at a rate of about 1,600 Å/min, and had a dielectric constant (k) of about 4.5 measured using a SSM 5100 Hg CV measurement tool at 0.1 MHz. The film also exhibited a hardness of about 0.1 GPa.

E-BEAM @ 400° C. and 200 μc/cm²:

The deposited film was subjected to a high temperature electron beam (e-beam) treatment using a dose of about 200 μc/cm2, at about 4.5 KeV and 1.5 mA, and at about 400° C. The e-beam treatment lasted for about 30 seconds. Following the e-beam treatment, the film exhibited a dielectric constant of about 2.3 which is about 50% less than the non-cured film. The e-beam film also exhibited a hardness of about 0.7 GPa, which is about a 600% increase compared to the non-cured film.

While the foregoing is directed to embodiments of the present invention, other and further embodiments of the invention may be devised without departing from the basic scope thereof, and the scope thereof is determined by the claims that follow.

What is claimed is:

1. A method for depositing a low dielectric constant film, comprising:

delivering a gas mixture comprising one or more organosilicon compounds and one or more hydrocarbon compounds having at least one cyclic group to a substrate surface at deposition conditions sufficient to deposit a non-cured film comprising the at least one cyclic group on the substrate surface and having a hardness less than about 0.3 GPa, wherein the cyclic group is bonded to a linear or branched functional group; and substantially removing the at least one cyclic group from the non-cured film using an electron beam at curing conditions sufficient to provide a dielectric constant less than 2.5 and a hardness greater than 0.5 GPa.

2. The method of claim 1, wherein the one or more organosilicon compounds has an oxygen to silicon ratio of at least 1:1.

3. The method of claim 1, wherein the one or more organosilicon compounds has an oxygen to silicon ratio of at least 2:1.

4. The method of claim 1, wherein the one or more organosilicon compounds has an oxygen to silicon ratio of about 4:1.

5. The method of claim 1, wherein the one or more organosilicon compounds is selected from the group consisting of 1,3,5-trisilano-2,4,6-trimethylene, 1,3,5,7-tetramethylcyclotetrasiloxane (TMCTS), octamethylcyclotetrasiloxane (OMCTS), 1,3,5,7,9-pentamethylcyclopentasiloxane, 1,3,5,7-tetrasilano-2,6-dioxy-4,8-dimethylene, hexamethylcyclotrisiloxane, diethoxymethylsilane (DEMS), dimethyldimethoxysilane (DMDMOS), dimethoxymethylvinylsilane (DMMVS), trimethylsilane (TMS), derivatives thereof, and mixtures thereof.

6. The method of claim 1, wherein the gas mixture comprises two or more organosilicon compounds and the gas mixture further comprises one or more oxidizing gases, and wherein the electron beam has a dosage greater than about 200 micro coulombs per cm².

7. The method of claim 1, wherein the gas mixture further comprises an oxidizing gas.

8. The method of claim 7, wherein the oxidizing gas comprises oxygen, carbon dioxide, or 2,3-butanedione.

9. The method of claim 7, wherein the oxidizing gas comprises a mixture of two or more oxidants selected from the group consisting of ozone, oxygen, carbon dioxide, carbon monoxide, water and nitrous oxide.

10. The method of claim 1, wherein the deposition conditions comprise a power density ranging from about 0.03 W/cm² to about 3.2 W/cm².

11. The method of claim 10, wherein the curing conditions comprise a temperature greater than room temperature.

12. The method of claim 1, wherein the deposition conditions comprise a substrate temperature of about 100° C. to about 400° C. and a pressure from about 4 Torr to about 10 Torr.

13. The method of claim 1, wherein the curing conditions comprise an electron beam dosage from about 200 to about 400 micro coulombs per cm².

14. A method for depositing a low dielectric constant film, comprising:

delivering a gas mixture comprising in one or more organosilicon compounds and one or more hydrocarbon compounds having at least one cyclic group to a substrate surface at deposition conditions sufficient to deposit a non-cured film comprising the at least one cyclic group on the substrate surface and having a hardness less than about 0.3 GPa; and substantially removing the at least one cyclic group from the non-cured film using an electron beam at curing conditions sufficient to provide a dielectric constant less than 2.5 and a hardness greater than 0.5 GPa, wherein the one or more hydrocarbon compounds having at least one cyclic group is selected from the group consisting of alpha-terpinene (ATP), vinylcyclohexane (VCH), phenylacetate, and combinations thereof.

15. A method for depositing a low dielectric constant film, comprising:

delivering a gas mixture comprising one or more organosilicon compounds, one or more hydrocarbon compounds having at least one cyclic group, and two or more oxidizing gases to a substrate surface at deposition conditions sufficient to deposit a non-cured film comprising the at least one cyclic group on the substrate surface and having a hardness less than 0.3 GPa, wherein the cyclic group is bonded to a linear or branched functional group; and substantially removing the at least one cyclic group from the non-cured film using an electron beam at curing conditions sufficient to provide a dielectric constant less than 2.2 and a hardness greater than 0.4 GPa.

16. The method of claim 15, wherein the one or more organosilicon compounds is selected from the group consisting of 1,3,5-trisilano-2,4,6-trimethylene, 1,3,5,7-tetramethylcyclotetrasiloxane (TMCTS), octamethylcyclotetrasiloxane (OMCTS), 1,3,5,7,9-pentamethylcyclopentasiloxane, 1,3,5,7-tetrasilano-2,6-dioxy-4,8-dimethylene, hexamethylcyclotrisiloxane. diethoxymethylsilane (DEMS), dimethyldimethoxysilane (DMDMOS), dimethoxymethylvinylsilane (DMMVS), trimethylsilane (TMS), derivatives thereof, and mixtures thereof.

17. The method of claim 15, wherein the two or more oxidizing gases comprise oxygen, carbon dioxide, 2,3-butanedione, ozone, carbon monoxide, water or nitrous oxide.

18. A method for depositing a low dielectric constant film, comprising:

delivering a gas mixture comprising one or more organosilicon compounds, one or more hydrocarbon compounds having at least one cyclic group, and two or more oxidizing gases to a substrate surface at deposition conditions sufficient to deposit a non-cured film comprising the at least one cyclic group on the substrate surface and having a hardness less than 0.3 GPa; and substantially removing the at least one cyclic group from the non-cured film using an electron beam at curing conditions sufficient to provide a dielectric constant less than 2.2 and a hardness greater than 0.4 GPa, wherein the one or more hydrocarbon compounds having at least one cyclic group is selected from the group consisting of alpha-terpinene (ATP), vinylcyclohexane (VCH), phenylacetate, and combinations thereof.

19. A method for depositing a low dielectric constant film, comprising:

delivering a gas mixture comprising an organosilicon compound and a hydrocarbon compound having at least one cyclic group, wherein the cyclic group is bonded to a linear or branched functional group, to a substrate surface at deposition conditions sufficient to deposit a non-cured film comprising the at least one cyclic group on the substrate surface; and substantiany removing the at least one cyclic group from the non-cured film using an electron beam at curing conditions sufficient to provide a dielectric constant less than 2.5.

20. The method of claim 19, wherein the hydrocarbon compound having at least one cyclic group is selected from the group consisting of alpha-terpinene (ATP), vinylcyclohexane (VCH), phenylacetate, and combinations thereof.

21. The method of claim 19, wherein the organosilicon compound is selected from the group consisting of 1,3,5-trisilano- 2,4,6-trimethylene, 1,3,5,7-tetramethylcyclotetrasiloxane (TMCTS), octamethylcyclotetrasiloxane (OMCTS), 1,3,5,7,9-pentamethylcyclopentasiloxane, 1,3,5,7-tetrasilano-2,6-dioxy-4,8-dimethylene, hexamethylcyclotrisiloxane, diethoxymethylsilane (DEMS), dimethyldimethoxysilane (DMDMOS), dimethoxymethylvinylsilane (DMMVS), trimethylsilane (TMS), derivatives thereof, and mixtures thereof.

22. The method of claim 19, wherein the gas mixture further comprises one or more oxidizing gases comprising oxygen, carbon dioxide, 2,3-butanedione, ozone, carbon monoxide, water or nitrous oxide.

23. The method of claim 19, wherein the organosilicon compound is a mixture of at least one linear organosilicon compound and at least one cyclic organosilicon compound.

24. The method of claim 19, wherein the cyclic group is bonded to a linear functional group.

25. A method for depositing a low dielectric constant film, comprising:

delivering a gas mixture comprising one or more organosilicon compounds, one or more hydrocarbon compounds having at least one cyclic group, and two or more oxidizing gases to a substrate surface at deposition conditions sufficient to deposit a non-cured film comprising the at least one cyclic group on the substrate surface and having a hardness less than 0.3 GPa; and substantially removing the at least one cyclic group from the non-cured film using an electron beam at curing conditions sufficient to provide a dielectric constant less than 2.2 and a hardness greater than 0.4 GPa, wherein the two or more oxidizing gases comprise carbon dioxide and oxygen, and the gas mixture comprises a greater amount of carbon dioxide than oxygen.

* * * * *

UNITED STATES PATENT AND TRADEMARK OFFICE
CERTIFICATE OF CORRECTION

PATENT NO.         : 7,060,330 B2
APPLICATION NO. : 10/302393
DATED              : June 13, 2006
INVENTOR(S)       : Yi Zheng et al.

It is certified that error appears in the above-identified patent and that said Letters Patent is hereby corrected as shown below:

On Title Page, col. 1

Item [60], Related U.S. Application Data: Please include the following claim to priority:

Provisional application No. 60/378,799, filed May 8, 2002.

Column 11, Line 46: After "between", delete "of"

Column 15, Line 23: Change "A/min" to --Å/min--

Column 15, Line 67: After "dioxide", insert --, at--

Column 16, Line 3: Change "o"to --to--

Column 16, Line 21: Change "μc/cm2" to --μc/cm$^2$--

Column 16, Line 41: Change "o"to --to--

Column 16, Line 50: Change "μc/cm2" to --μc/cm$^2$--

Column 17, Line 3: Change "o" to --to--

Column 17, Line 12: Change "μc/cm2" to --μc/cm$^2$--

UNITED STATES PATENT AND TRADEMARK OFFICE
CERTIFICATE OF CORRECTION

PATENT NO. : 7,060,330 B2
APPLICATION NO. : 10/302393
DATED : June 13, 2006
INVENTOR(S) : Yi Zheng et al.

It is certified that error appears in the above-identified patent and that said Letters Patent is hereby corrected as shown below:

In the Claims

Column 18, Claim 14, Line 18: After "comprising", delete "in"

Column 19, Claim 19, Line 26: Change "substantiany" to --substantially--

Signed and Sealed this

Fourteenth Day of November, 2006

JON W. DUDAS
*Director of the United States Patent and Trademark Office*